(12) United States Patent
Hung et al.

(10) Patent No.: US 8,748,320 B2
(45) Date of Patent: Jun. 10, 2014

(54) CONNECTION TO FIRST METAL LAYER IN THIN FILM TRANSISTOR PROCESS

(71) Applicant: Apple Inc., Cupertino, CA (US)

(72) Inventors: Ming-Chin Hung, Cupertino, CA (US); Young Bae Park, Cupertino, CA (US); Chun-Yao Huang, Cupertino, CA (US); Shih Chang Chang, Cupertino, CA (US); John Z. Zhong, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/629,547

(22) Filed: Sep. 27, 2012

(65) Prior Publication Data

US 2014/0084292 A1  Mar. 27, 2014

(51) Int. Cl.
*H01L 21/311* (2006.01)

(52) U.S. Cl.
USPC .......................................... 438/694

(58) Field of Classification Search
CPC ................... H01L 21/31116; H01L 21/31144; H01L 21/3229
USPC .......................................... 438/104, 694, 758
See application file for complete search history.

(56) References Cited

U.S. PATENT DOCUMENTS

| | | | |
|---|---|---|---|
| 4,958,205 A | 9/1990 | Takeda et al. | |
| 5,075,237 A | 12/1991 | Wu | |
| 5,642,129 A | 6/1997 | Zavracky et al. | |
| 5,668,613 A | 9/1997 | Kim et al. | |
| 5,698,902 A | 12/1997 | Uehara et al. | |
| 5,721,155 A | 2/1998 | Lee | |
| 5,990,492 A | 11/1999 | Kim et al. | |
| 5,994,721 A | 11/1999 | Zhong et al. | |
| 6,372,636 B1* | 4/2002 | Chooi et al. | 438/639 |
| 6,406,928 B1 | 6/2002 | Jen | |
| 6,479,398 B1 | 11/2002 | Chen, Jr. | |
| 6,509,614 B1* | 1/2003 | Shih | 257/350 |
| 6,525,342 B2 | 2/2003 | Amemiya | |
| 6,686,273 B2 | 2/2004 | Hsu et al. | |
| 6,812,637 B2 | 11/2004 | Cok et al. | |
| 6,967,407 B2 | 11/2005 | Otani et al. | |
| 7,045,406 B2 | 5/2006 | Huotari et al. | |
| 7,199,518 B2 | 4/2007 | Couillard | |
| 7,209,057 B2 | 4/2007 | Hashido et al. | |
| 7,227,542 B2 | 6/2007 | Koyama | |
| 7,402,468 B2 | 7/2008 | Park et al. | |
| 7,419,858 B2 | 9/2008 | Schuele et al. | |

(Continued)

FOREIGN PATENT DOCUMENTS

| | | |
|---|---|---|
| EP | 0376329 | 7/1990 |
| EP | 2048538 | 4/2009 |

(Continued)

*Primary Examiner* — Nikolay Yushin
(74) *Attorney, Agent, or Firm* — Brownstein Hyatt Farber Schreck, LLP

(57) ABSTRACT

A method of connecting to a first metal layer in a semiconductor flow process. Disclosed embodiments connect to the first metal layer by etching a first portion of a viahole through an etch stop layer and a gate insulation layer to reach a first metal layer, depositing a second metal layer such that the second metal layer contacts the first metal layer within the viahole, and etching a second portion of the viahole through a first passivation layer and an organic layer to reach the second metal layer.

17 Claims, 14 Drawing Sheets

(56) References Cited

U.S. PATENT DOCUMENTS

| | | |
|---|---|---|
| 7,510,891 B2 | 3/2009 | Chun et al. |
| 7,550,306 B2 | 6/2009 | Park et al. |
| 7,553,707 B2 | 6/2009 | Horino et al. |
| 7,563,669 B2 | 7/2009 | Chittipeddi et al. |
| 7,609,342 B2 | 10/2009 | Yang et al. |
| 7,671,939 B2 | 3/2010 | Araki et al. |
| 7,759,857 B2 | 7/2010 | Vaufrey et al. |
| 7,843,130 B2 | 11/2010 | Shimizu et al. |
| 7,919,918 B2 | 4/2011 | Kim |
| 7,952,104 B2 | 5/2011 | Leonardi et al. |
| 7,956,825 B2 | 6/2011 | Kane |
| 7,969,087 B2 | 6/2011 | Hwang et al. |
| 7,973,470 B2 | 7/2011 | Cok |
| 8,053,978 B2 | 11/2011 | Hwang et al. |
| 8,064,028 B2 | 11/2011 | Katayama et al. |
| 8,072,080 B2 | 12/2011 | Moriwaki |
| 8,102,338 B2 | 1/2012 | Hwang et al. |
| 8,133,748 B2 | 3/2012 | Yamazaki et al. |
| 8,278,162 B2 | 10/2012 | Akimoto et al. |
| 8,278,661 B2 | 10/2012 | Song |
| 8,294,147 B2 | 10/2012 | Yamazaki et al. |
| 8,339,531 B2 | 12/2012 | Yamauchi |
| 8,363,197 B2 | 1/2013 | Matsuda et al. |
| 8,368,674 B2 | 2/2013 | Kim et al. |
| 8,377,762 B2 | 2/2013 | Eguchi et al. |
| 8,455,872 B2 | 6/2013 | French |
| 8,471,256 B2 | 6/2013 | Yamazaki et al. |
| 8,508,562 B2 | 8/2013 | Akimoto et al. |
| 8,508,709 B2 | 8/2013 | Huang et al. |
| 8,568,877 B2 | 10/2013 | Ferrari et al. |
| 8,610,860 B2 | 12/2013 | Huang et al. |
| 2002/0177281 A1* | 11/2002 | Amemiya et al. ............ 438/300 |
| 2003/0076282 A1 | 4/2003 | Ikeda et al. |
| 2003/0193090 A1* | 10/2003 | Otani et al. .................... 257/758 |
| 2006/0186409 A1* | 8/2006 | Horino et al. .................... 257/59 |
| 2007/0268229 A1 | 11/2007 | Kang et al. |
| 2008/0252202 A1 | 10/2008 | Li et al. |
| 2009/0102052 A1 | 4/2009 | Ryu |
| 2010/0156771 A1 | 6/2010 | Lee et al. |
| 2010/0330811 A1 | 12/2010 | Nagao |
| 2011/0012125 A1 | 1/2011 | Nicholas |
| 2011/0062434 A1* | 3/2011 | Eguchi et al. .................... 257/43 |
| 2011/0227850 A1 | 9/2011 | Oh et al. |
| 2012/0087460 A1 | 4/2012 | Moriwaki |
| 2012/0105495 A1 | 5/2012 | Choi |
| 2012/0119211 A1 | 5/2012 | Lin |
| 2012/0205658 A1 | 8/2012 | Yamazaki et al. |
| 2012/0248455 A1 | 10/2012 | Van Gestel |
| 2012/0268396 A1 | 10/2012 | Kim et al. |
| 2012/0299976 A1 | 11/2012 | Chen et al. |
| 2013/0027646 A1 | 1/2013 | Cho et al. |
| 2013/0069061 A1* | 3/2013 | Nakazawa ....................... 257/43 |
| 2013/0161622 A1 | 6/2013 | Lee |
| 2013/0328053 A1 | 12/2013 | Roudbari et al. |
| 2013/0335658 A1 | 12/2013 | Huang et al. |
| 2013/0337596 A1 | 12/2013 | Hung et al. |
| 2014/0061656 A1 | 3/2014 | Yu et al. |
| 2014/0070225 A1 | 3/2014 | Yu et al. |
| 2014/0091390 A1 | 4/2014 | Hung et al. |
| 2014/0103349 A1 | 4/2014 | Yu et al. |
| 2014/0104527 A1 | 4/2014 | Yang et al. |

FOREIGN PATENT DOCUMENTS

| | | | |
|---|---|---|---|
| JP | 2010056015 | 3/2010 | |
| WO | WO 2011/030620 | 3/2011 | |
| WO | WO 2011/151970 | 12/2011 | |
| WO | WO2011/151970 | * 12/2011 | ............ H01L 21/336 |

* cited by examiner

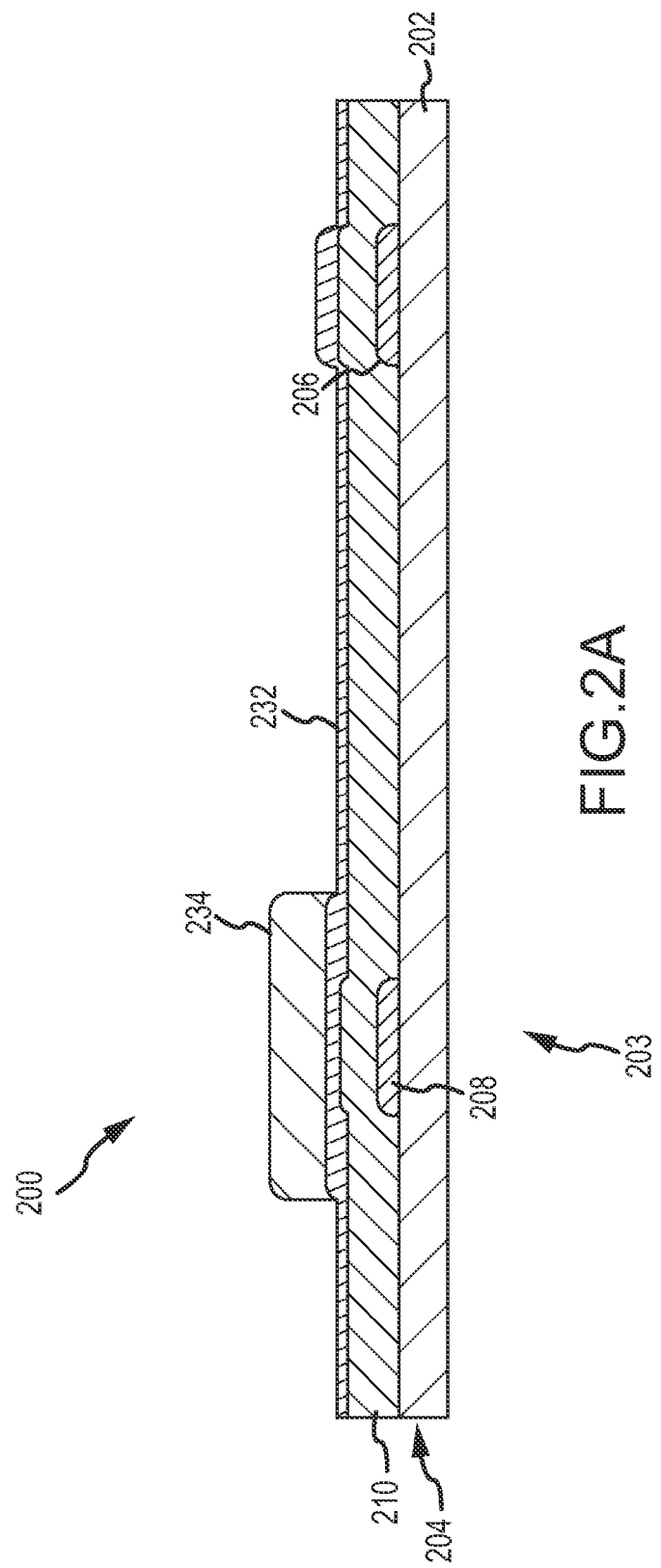

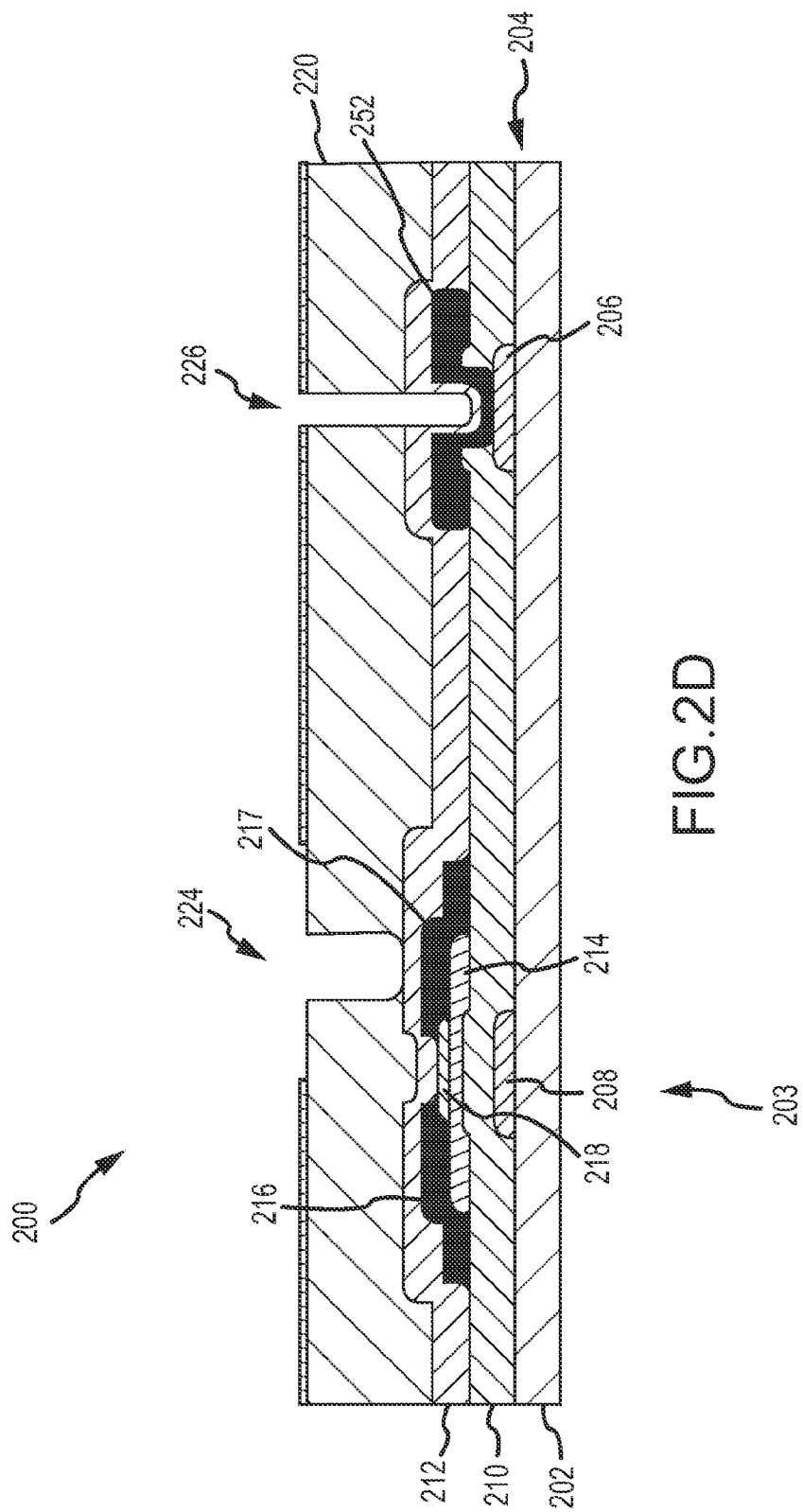

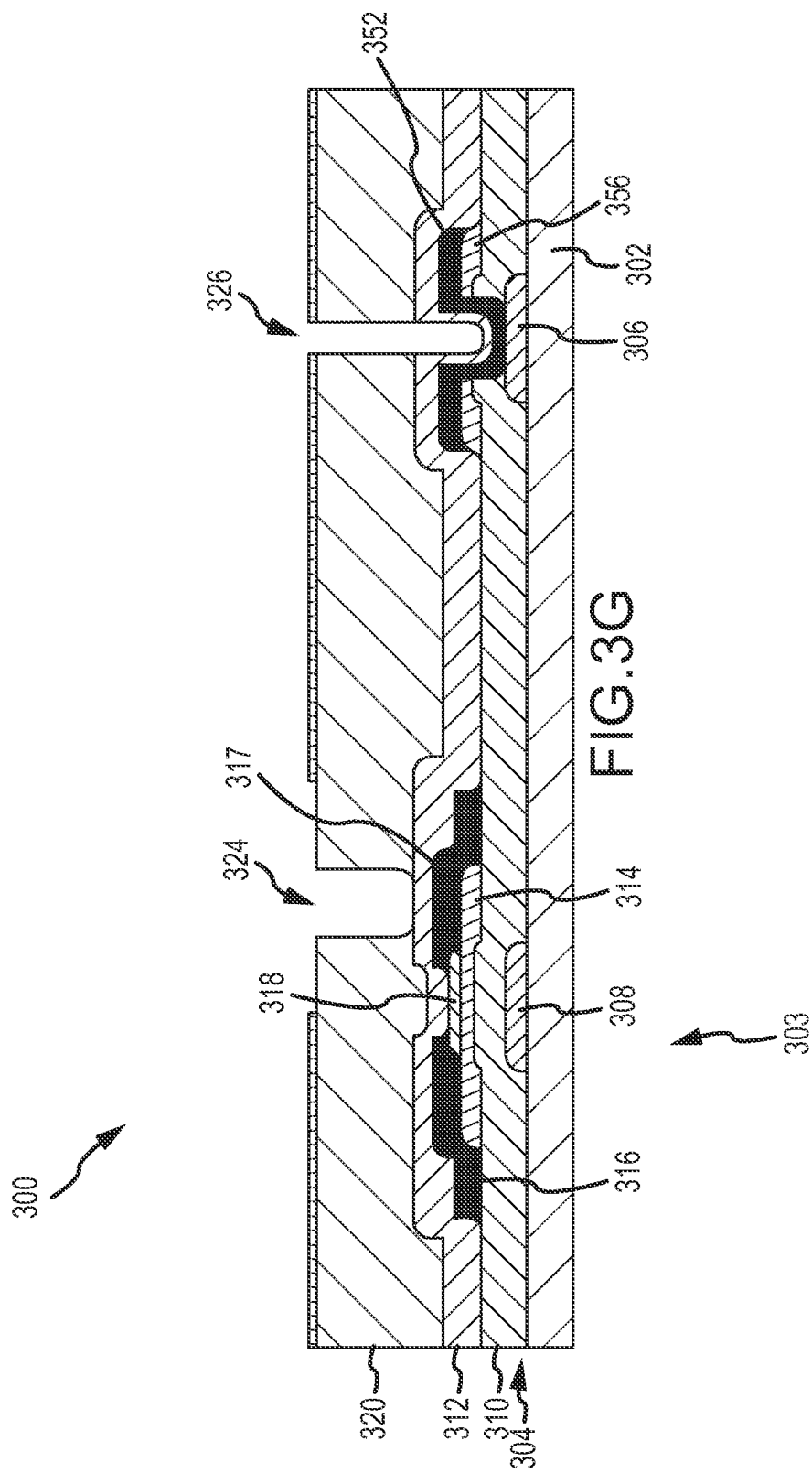

CONNECTION TO FIRST METAL LAYER IN THIN FILM TRANSISTOR PROCESS

TECHNICAL FIELD

The present disclosure generally relates to viahole connections between layers in thin film transistors devices and processes for making those connections.

BACKGROUND

Currently, an eight mask process flow is used to manufacture etch stop oxide thin film transistors devices. Forming a viahole that connects to the first metal layer in such a process typically requires long dry etching time through a number of passivation layers and through the gate insulation layer. A viahole dry etch process of this magnitude presents several difficulties including photoresist stability during the long time dry etch, tapper and undercut issues the can impact one or more layers in multi SiNx/SiO2 stacks, and the possibility of damage to the device due to an electrostatic discharge. Thus, there is a need for an improved viahole etch process that can be used to connected to signal lines that are routed in the first metal layer.

SUMMARY

In various embodiments, the present disclosure relates to a method of connecting to a first metal layer in a semiconductor flow process, comprising etching a first portion of a viahole through an etch stop layer and a gate insulation layer to reach a first metal layer; depositing a second metal layer such that the second metal layer contacts the first metal layer within the viahole; and etching a second portion of the viahole through a first passivation layer and an organic layer to reach the second metal layer.

In some embodiments, the operation of etching a first portion of the viahole further comprises etching through a metal oxide layer.

In some embodiments, the operation of etching the first portion of the viahole occurs following a first set of semiconductor process operations, comprising forming the first metal layer on a substrate; forming the gate insulation layer on the first metal layer; forming a metal oxide layer on the gate insulation layer; forming an etch stop layer on the metal oxide layer; and forming a photoresist pattern on the etch stop layer.

In some embodiments, the photoresist pattern is formed such that no photoresist material is located on an area of the etch stop layer that is to be etched to form the viahole.

In some embodiments, the photoresist pattern is formed with a half tone mask such that photoresist material is formed in a layer having a full thickness area and a half thickness area.

In some embodiments, the full thickness area of the photoresist pattern is formed on area of the etch stop layer corresponding to an area that is to be formed as a channel of a thin film transistor.

In some embodiments, the operation of etching the first portion of the viahole includes etching the full thickness of the photoresist pattern to reach the etch stop layer.

In some embodiments, the etch stop layer that remains after the full thickness of the photoresist pattern has been etched protects the metal oxide of the thin film transistor during a subsequent etch that removes portions of the second metal layer.

In some embodiments, the half thickness area of the photoresist pattern is formed on areas of the etch stop layer not including an area that is to be formed as a channel of a thin film transistor and not including the area that is to be etched to form the viahole.

In some embodiments, the operation of etching the first portion of the viahole includes etching the half thickness of the photoresist pattern and the etch stop layer that underlies the half thickness of photoresist to reach the gate insulation layer.

In some embodiments, the gate insulation layer is silicon dioxide.

In some embodiments, the gate insulation layer is SiNx.

In some embodiments, the metal oxide layer is indium gallium zinc oxide.

In some embodiments, the operation of etching the second portion of the viahole occurs following a second set of semiconductor process operations that occur after the operation of depositing the second metal layer, the second set of operations comprising forming a photoresist pattern on the second metal layer; etching the second metal layer such that the photoresist pattern causes the second metal layer to remain within the viahole and to remain on areas that form a source and a drain of a thin film transistor; depositing the first passivation layer; and depositing the organic layer.

Some embodiments further comprise depositing a thin film of transparent conducting oxide after the operation of etching the second portion of the viahole.

In some embodiments, the transparent conducting oxide is indium tin oxide.

In some embodiments, the viahole provides a connection to a VCOM signal that is routed in the first metal layer.

In various embodiments, the present disclosure relates to a method of connecting to a first metal layer in a semiconductor process, comprising etching a first portion of a viahole through an etch stop layer, a metal oxide layer, and a gate insulation layer to reach a first metal layer; depositing a second metal layer such that the second metal layer contacts the first metal layer within the viahole; and etching a second portion of the viahole through a second passivation layer and a first passivation layer to reach the second metal layer.

In some embodiments, the operation of etching the first portion of the viahole through the metal oxide layer comprises a dry etch through the etch stop layer, a wet etch through the metal oxide layer, and a dry etch through the gate insulation layer.

In some embodiments, the operation of etching the first portion of the viahole occurs following a first set of semiconductor process operations, comprising forming the first metal layer on a substrate; forming the gate insulation layer on the first metal layer; forming a metal oxide layer on the gate insulation layer; forming a first photoresist pattern on the metal oxide layer; etching the metal oxide layer such that the first photoresist pattern causes metal oxide material to remain on an area to be formed as a metal oxide of a thin film transistor and on an area to be etched for the viahole; forming an etch stop layer on the metal oxide layer; and forming a second photoresist pattern on the etch stop layer such that no photoresist material is located on the area to be etched for the viahole.

In various embodiments, the present disclosure relates to a thin film transistor display panel, comprising a $V_{COM}$ signal line that is routed in a first metal layer disposed on a substrate; a second metal layer that contacts the first metal layer at the $V_{COM}$ signal line; a viahole that extends through layers above the second metal layer to connect to the second metal layer at the $V_{COM}$ signal line; and a thin film of transparent conducting oxide disposed at least on an interior surface of the viahole.

BRIEF DESCRIPTION OF THE DRAWINGS

FIGS. 2A through 2E illustrate a process flow for an etch stop oxide thin film transistor device 200 embodiment that includes a two part etch that connects to a signal line routed in a first metal layer; and FIGS. 3A through 3H illustrate an alternative process flow for an etch stop oxide thin film transistor device 200 embodiment that includes a two part etch that connects to a signal line routed in a first metal layer.

DETAILED DESCRIPTION

The present disclosure is generally directed to a method of connecting to a first metal layer in a semiconductor flow process. Process embodiments discussed herein connect to the first metal layer by etching a first portion of a viahole through an etch stop layer and a gate insulation layer to reach a first metal layer, depositing a second metal layer such that the second metal layer contacts the first metal layer within the viahole, and etching a second portion of the viahole through a first passivation layer and an organic layer to reach the second metal layer. Embodiments discussed herein may be used in the specific context of thin film transistor display panels to make a connection to a $V_{COM}$ signal line that provides a reference for the backplane or back plate of the panel.

Figure 1:
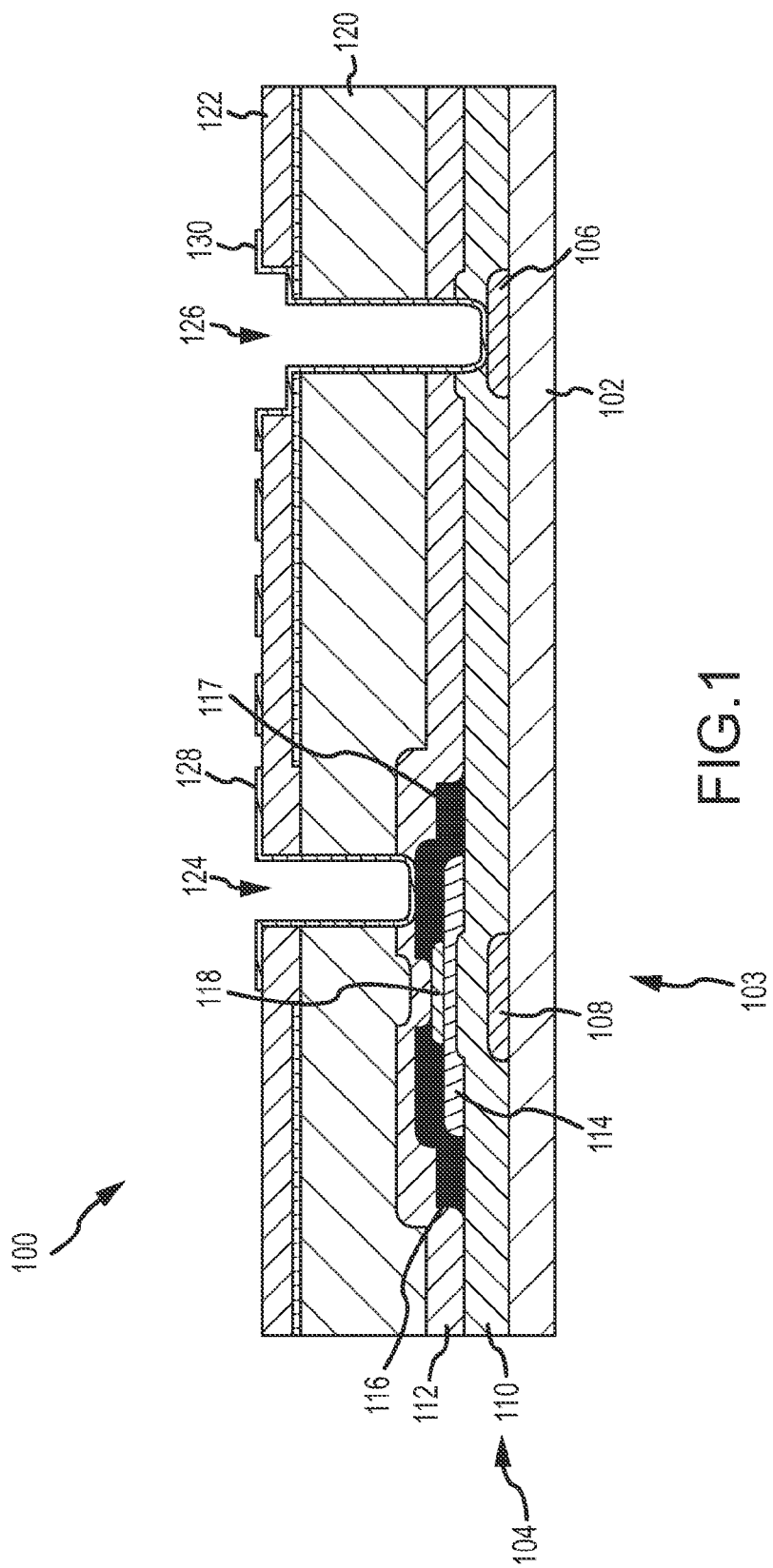
FIG. 1 is a cross-sectional area of a prior art semiconductor device that includes a thin film transistor and connect to a signal line routed in a first metal layer.

Currently, an eight mask process flow is used to manufacture etch stop oxide thin film transistors devices. In the specific context of thin film transistor display panels, this manufacturing process includes making a connection to a $V_{COM}$ signal line that provides a reference for the backplane or back plate of the panel. Typically, the $V_{COM}$ signal line is routed in the first metal layer and is connected to a transparent conducting oxide through a viahole that extends through a number of layers of the device. FIG. 1 is a cross-sectional area of semiconductor device 100 that represents a portion of one such prior art thin film transistor display panel.

The semiconductor device 100 shown in FIG. 1 includes at least one thin film transistor 103. The transistor 103 and other structures of the device are include elements that are located in a first metal layer 104 disposed on a substrate 102. The first metal layer 104 includes a gate 108 for the thin-film transistor 103. The thin-film transistor 103 additionally includes a metal oxide 114 that forms the metal oxide of the transistor 103. The metal oxide 114 sits on a gate insulation layer 110, which is disposed on the first metal layer 104. The metal oxide 114 is connected to a source 116 electrode and to a drain 117 electrode, each of which is formed in a second metal layer. The thin-film transistor 103 contains an etch stop 118 element that sits on the metal oxide 114. The etch stop 118 element serves to protect the metal oxide of the transistor 103 during an etching process that forms the source 116 and drain 117 electrodes. A viahole 124 provides a connection to the thin-film transistor 103 at the drain 117. As shown in FIG. 1, the viahole 124 extends through a first passivation layer 112, an organic layer 120, and a second passivation layer 122. The viahole 124 makes electrical contact with the drain 117 through a thin film of transparent conducting oxide 128 that is deposited on an interior of the viahole 124.

As mentioned above, the semiconductor device 100 may be a portion of a thin film transistor display panel. In this case, the transistor 103 may implement or otherwise be associated with one of a number of pixels in the display panel. In addition to transistors that implement pixels, a thin film transistor display panel will also typically include a Vcom signal line. The Vcom signal provides a reference for the backplane or back plate of the panel. The semiconductor device 100 shown in FIG. 1 includes a Vcom signal line 106 that is routed in the first metal layer 104. The semiconductor device 100 also includes a viahole 126 that extends through number of layers to make a connection to the Vcom line 106. Like the viahole 124, the viahole 126 extends through a first passivation layer 112, the organic layer 120, and the second passivation layer 122. In addition to extending through these layers, the viahole 126 extends through the gate insulation layer 110 to reach the Vcom signal line 106. The viahole 126 makes electrical contact with the Vcom signal line 106 through a thin film of transparent conducting oxide 128 that is deposited on an interior of the viahole 126.

In prior art processes such as the one used to manufacture the device shown in FIG. 1, forming this viahole typically requires long dry etching time through a number of passivation layers and through the gate insulation layer. The total thickness of the layers to be etched is approximately 0.8 um. A viahole dry etch process of this magnitude presents several difficulties including photoresist stability during the long time dry etch, tapper and undercut issues the can impact one or more layers in multi SiNx/SiO2 stacks, and the possibility of damage to the device due to an electrostatic discharge.

Embodiments discussed herein address the above issues by dividing the long one time dry etch into two separate short time etches. Specifically, the first viahole etch occurs during etch-stop layer patterning by using a halftone process. This first etch may be done with or without a metal oxide layer being used as a hard mask. The second viahole etch occurs after the passivation layers have been applied to the device. One advantage of this process is that it can reduce by about 50% the dry etch thickness when compared to existing processes. Another benefit is that that short distances are etched and thus the risk of damage from electrostatic discharge is reduced.

FIGS. 2A through 2E illustrate a process flow for an etch stop oxide thin film transistor device 200 in accordance with embodiments discussed herein. The process flow illustrated in FIGS. 2A through 2E includes a two-part etch process for a viahole that makes a connection to a $V_{COM}$ signal line, which is routed in the first metal layer.

The process flow for the construction of the semiconductor device 200 begins with the application of a first mask that is used to form device features that are routed in a first metal layer 204. First, a layer of metal is deposited on an exposed surface of a substrate 202. Next, unwanted areas of metal are removed as dictated by the first mask so as to form device features. As shown in FIG. 2A, this application of the first mask operates to form at least a $V_{COM}$ signal line 206, as well as a gate 208 for a thin film transistor 203.

After the first mask is applied, a gate insulation layer 210 is deposited onto the semiconductor device 200, covering both the $V_{COM}$ signal line 206 and the gate 208 of the transistor 203. In one embodiment, the gate insulation layer 210 is composed of silicon dioxide ($SiO_2$). In another embodiment, the gate insulation layer 210 is composed of SiNx.

The process flow for the construction of the semiconductor device 200 continues with the application of a second mask that is used to form device features that are disposed in a layer of metal oxide. In one embodiment, the metal oxide is indium gallium zinc oxide (IGZO). First, a layer 232 of metal oxide is deposited onto the exposed surface of the semiconductor device 200. Next, unwanted areas of the metal oxide layer 232 are etched away or otherwise removed as dictated by the second mask so as to form device features. This application of the second mask operates to form the metal oxide structure 214 for the transistor 203, as shown in detail in FIG. 2A and FIG. 2B.

Figure 2B:
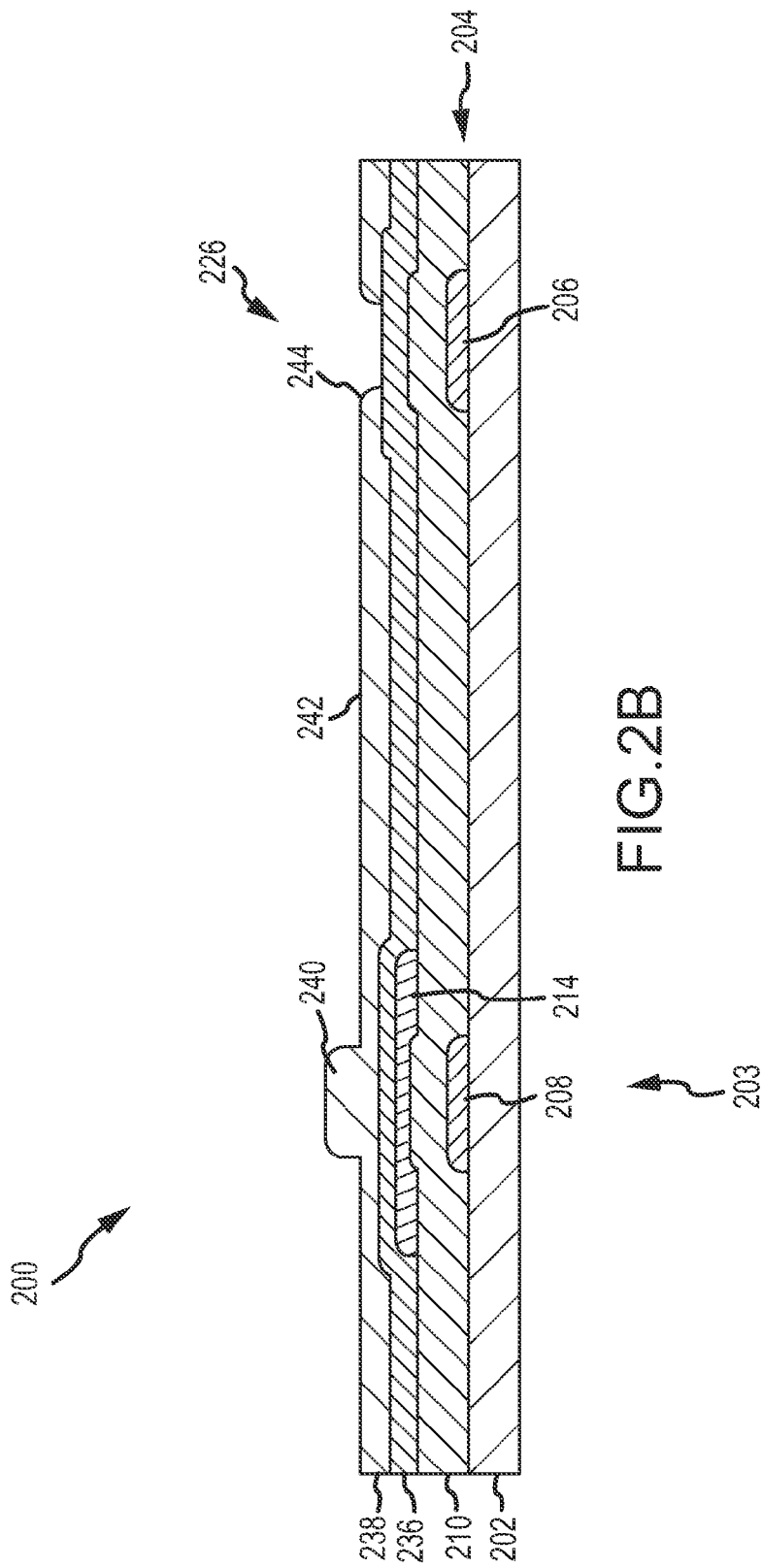

FIG. 2A is an illustration of a semiconductor device 200 prior to the application of a light source or other energy source that removes unwanted portions of the metal oxide layer 232. Specifically, FIG. 2A shows a photoresist pattern 234 that is applied as dictated by the second mask. The photoresist pattern 234 covers wanted portions of the metal oxide layer 232 such that the light source affects the photoresist and leaves the underlying areas unaffected. Likewise, the photoresist pattern 234 does not cover unwanted portions of the metal oxide layer 232 such that these areas are exposed to the light source. Thus, the application of the light source will remove the photoresist pattern 234 and unwanted portions of the metal oxide layer 232 such that metal oxide remains above the gate 208 in order to form the metal oxide structure 214 of the transistor 203. The device features that result from the application of the second mask can be seen in the FIG. 2B.

Figure 2C:
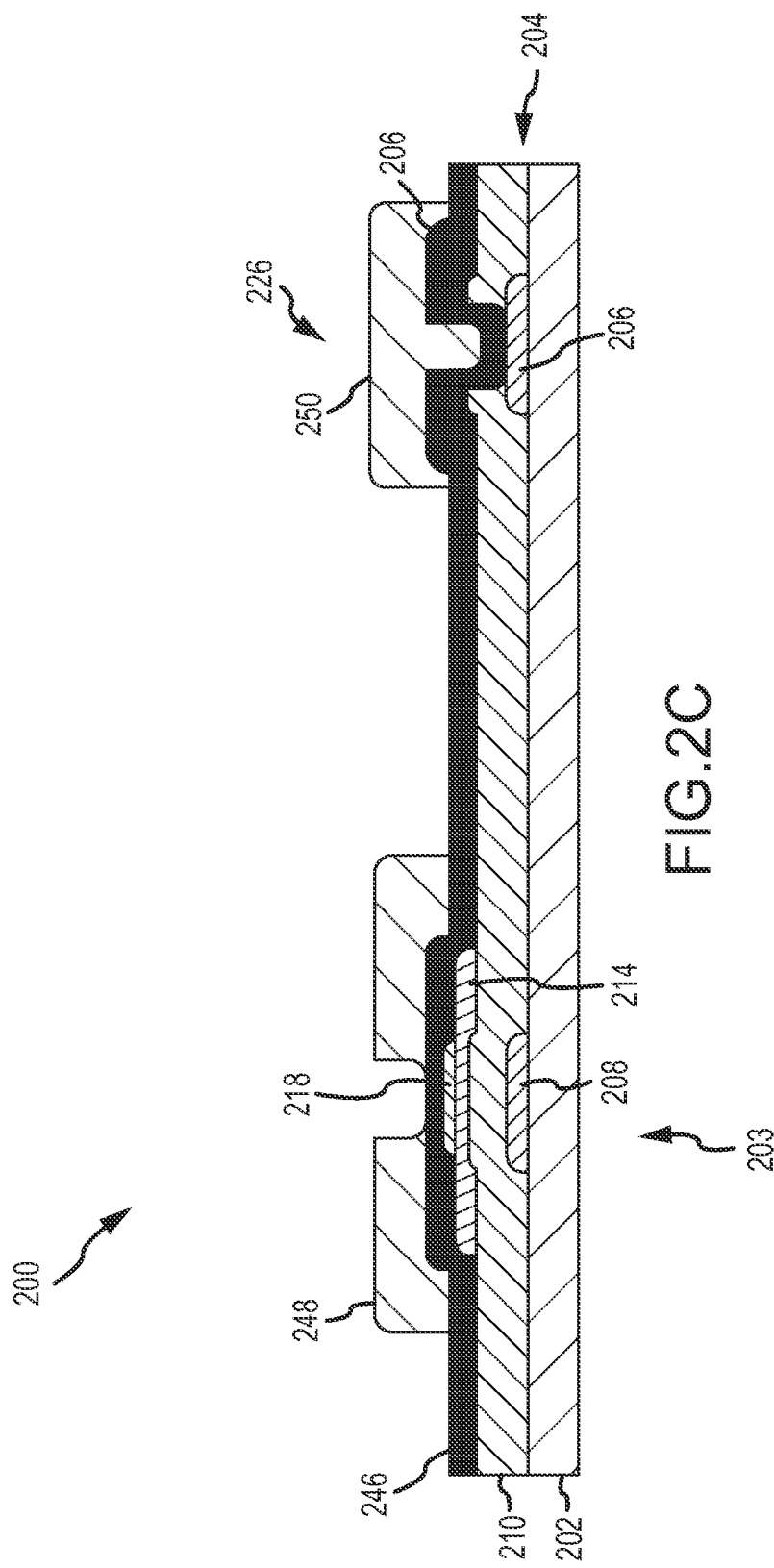

FIG. 2B additionally illustrates the application of a third mask used in the construction of the semiconductor device 200. In one respect, the third mask is used to form device features that are located in an etch stop layer. In another respect, the mask operates to enable a first of two etches that create the connection to the $V_{COM}$ signal line 206, which is routed in the first metal layer 204. In order to accomplish both of these tasks, the third mask is a half tone mask that produces a photoresist pattern 238 having a variable thickness. More specifically, the photoresist pattern 238 includes an area of full thickness 240 and an area of half thickness 242. Additionally, the photoresist pattern 238 produced by the third mask includes an area 244 having no photoresist material. The operation of the third mask is illustrated in FIGS. 2B and 2C.

First, as shown in FIG. 2B, a layer 236 of etch stop material is deposited onto an exposed surface of the semiconductor device 200. Next, in preparation for an etching operation, a photoresist pattern 238 is deposited onto the etch stop layer 236 in a pattern that is dictated by the third mask. As can be seen in FIG. 2B, the photoresist pattern 238 is formed with a half tone mask such that photoresist material is formed in a layer 238 having a full thickness area 240. The full thickness area 240 of the photoresist pattern 238 is formed on an area of the etch stop layer 236 corresponding to an area that is to be formed as a metal oxide of the thin film transistor 203. When the etching operation occurs, the full thickness 240 of the photoresist pattern 238 is etched away to expose or otherwise reach the etch stop layer 236. The etch stop element 218 that remains after the full thickness 240 of the photoresist pattern 238 has been etched protects the metal oxide structure 214 of the thin film transistor 203 during a subsequent etch that removes portions of a second metal layer.

As can also be seen in FIG. 2B, the photoresist pattern 238 (which is deposited as dictated by the half-tone third mask in preparation for an etching operation) is formed such that no photoresist material is located on an area 244 of the etch stop layer 236 that is above the $V_{COM}$ line 206, which is routed in the first metal layer 204. When the etching operation occurs, this area 244 is etched to form a portion of the viahole 226 that connects to the $V_{COM}$ line 206. Here, those portions of the etch stop layer 236 and the gate insulation layer 210 that are located in the area 244 are etched away so that the metal of the underlying $V_{COM}$ line 206 is exposed.

Further, the photoresist pattern 238 (which is deposited as dictated by the half-tone third mask in preparation for an etching operation) is formed such that photoresist material has a half thickness area 242. The half thickness area 242 of the photoresist pattern 238 is formed on areas of the etch stop layer 236 not including an area that is to be formed as a metal oxide of the thin film transistor 203 and not including the area 244 that is to be etched to form the viahole 226. When the etching operation occurs, the half thickness area 242 and those portions of the etch stop layer 236 that underlie the half thickness area 242 are etched away. Thus, following this etching operation, the gate insulation layer 210 is exposed in those areas that were covered by the half thickness area 242.

The process flow for the construction of the semiconductor device 200 continues with the application of a fourth mask that is used to form device features that are disposed in a second metal layer. In one respect, the application of the fourth mask operates to form the source electrode 216 and the drain electrode 217 for the transistor 103. In another respect, the application of the fourth mask operates to form a connection to the $V_{COM}$ line 206, which is routed in the first metal layer 204. First, the second metal layer 246 is deposited on the exposed surface of the semiconductor device 200. Here, metal is deposited in the first portion of the viahole 226 that was etched in connection with the application of the third mask. In this way, an electrical connection 252 to the $V_{COM}$ line 206 is formed when the layer two metal 246 contacts the layer one metal 204 that is exposed within the viahole 226. Following the deposition of the second metal layer 246, unwanted areas of the second layer 246 are etched away or otherwise removed as dictated by the fourth mask.

FIG. 2C is an illustration of a semiconductor device 200 prior to the application of a light source that removes unwanted portions of the second metal layer 246. Specifically, FIG. 2C shows first 248 and second 250 photoresist patterns that are applied as dictated by the fourth mask. The photoresist patterns 248, 250 cover wanted portions of the second metal layer 246 such that the light source affects the photoresist and leaves the underlying areas unaffected. Likewise, the photoresist patterns 248, 250 do not cover unwanted portions of the second metal layer 246 such that these areas are exposed to the light source. Thus, the application of the light source will remove the photoresist patterns 248, 250 and unwanted portions of the second metal layer 246 such that metal remains at two locations to form the source electrode 216 and the drain electrode 217 of the transistor 203. Additionally, after application of the light source, metal remains in the viahole 226 in order to maintain the connection 252 to the $V_{COM}$ line 206, which routed in the first metal layer 204. The device features that result from the application of the fourth mask can be seen in the FIG. 2D.

The process flow for the construction of the semiconductor device 200 continues with the application of a fifth mask that is used to create a passivation layer 212 and an organic layer 220 having viaholes 224, 226 that extend there though to make connections to underlying device features. First, a passivation layer 212 and an organic layer 220 are deposited onto the exposed surface of a semiconductor device 200. Next, unwanted areas of the passivation layer 212 and the organic layer 220 are removed as dictated by the fifth mask so as to create viaholes 224, 226 that extend through the passivation layer 212 and the organic layer 220. As can be seen in FIG. 2D, the application of the fifth mask produces a via hole 224 that connects to the source 217 of the transistor 203. The application of the fifth mask additionally produces a portion of the viahole 226 that connects to the $V_{COM}$ line 206, which is routed in the first metal layer 204. More specifically, the viahole 226 connects to the $V_{COM}$ line 206 through the connection 252 that is disposed in the second metal layer 246.

Figure 2E:
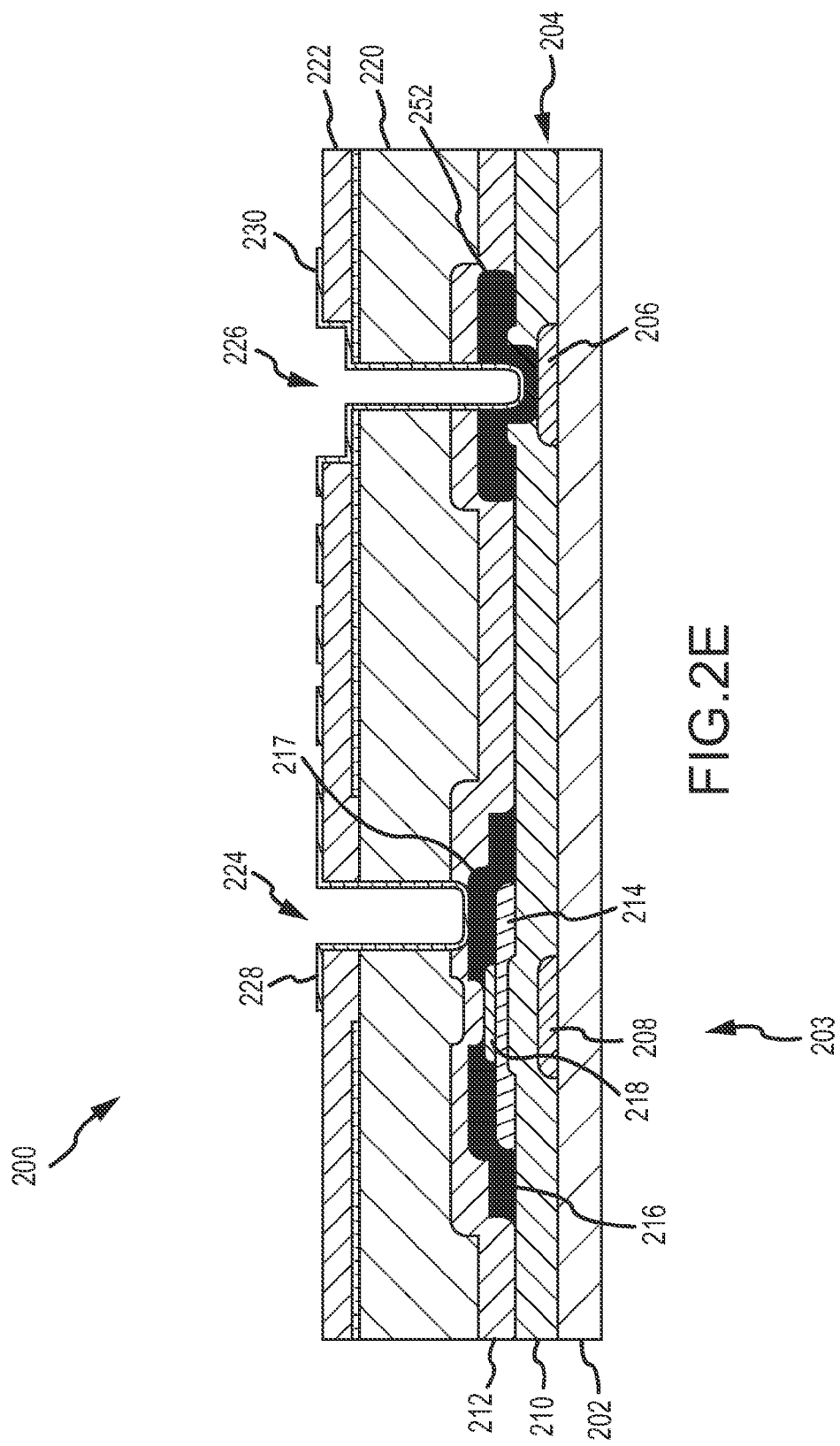

Following the application of the fifth mask, the process flow for the construction of the semiconductor device 200 continues with the application of a sixth mask that applies a thin film of transparent conducting oxide 230 which provides a connection to the $V_{COM}$ line 206. In one embodiment, the thin film of transparent conducting oxide is indium tin oxide (ITO). As shown in FIG. 2E, the transparent conducting oxide 230 is applied in a pattern dictated by the sixth mask such that the transparent conducting oxide 230 is deposited on an interior surface of the viahole 226. In this way, the thin film of transparent conducting oxide 230 makes a connection to the $V_{COM}$ line 206, which is routed in the first metal layer 204. More specifically, the thin film of transparent conducting oxide 230 connects to the $V_{COM}$ line 206 through the connection 252 that is disposed in the second metal layer 246.

The process flow for the construction of the semiconductor device 200 continues with the application of a seventh mask that is used to create a second passivation layer 222 such that the viaholes that underlie the second passivation layer 222 are maintained. Following this, the process flow for the construction of the semiconductor device 200 continues with the application of an eighth mask that applies a thin film of transparent conducting oxide 228. As shown in FIG. 2E, the thin film of transparent conducting oxide 228 provides a connection to the transistor 203. The transparent conducting oxide 228 is applied in a pattern dictated by the eighth mask such that the transparent conducting oxide 228 is deposited on an interior surface of the viahole 224. In this way, the thin film of transparent conducting oxide 228 makes a connection to the drain 217 of the transistor 203.

The application of the fifth mask produces a second portion of the viahole 226. As described above, the first portion of the viahole 226 is formed during the application of the third mask. Thus, the etching of viahole 226 is divided into two separate steps that occur at different times during the construction of the semiconductor device 200. This two-step etch is advantageous because it avoids creating the viahole in a long single step etch.

FIGS. 3A through 3E illustrate a process flow for an etch stop oxide thin film transistor device 300 in accordance with an alternative embodiments discussed herein. The process flow illustrated in FIGS. 3A through 3E includes a two-part etch process for a viahole that makes a connection to a $V_{COM}$ signal line, which is routed in the first metal layer.

Figure 3A:
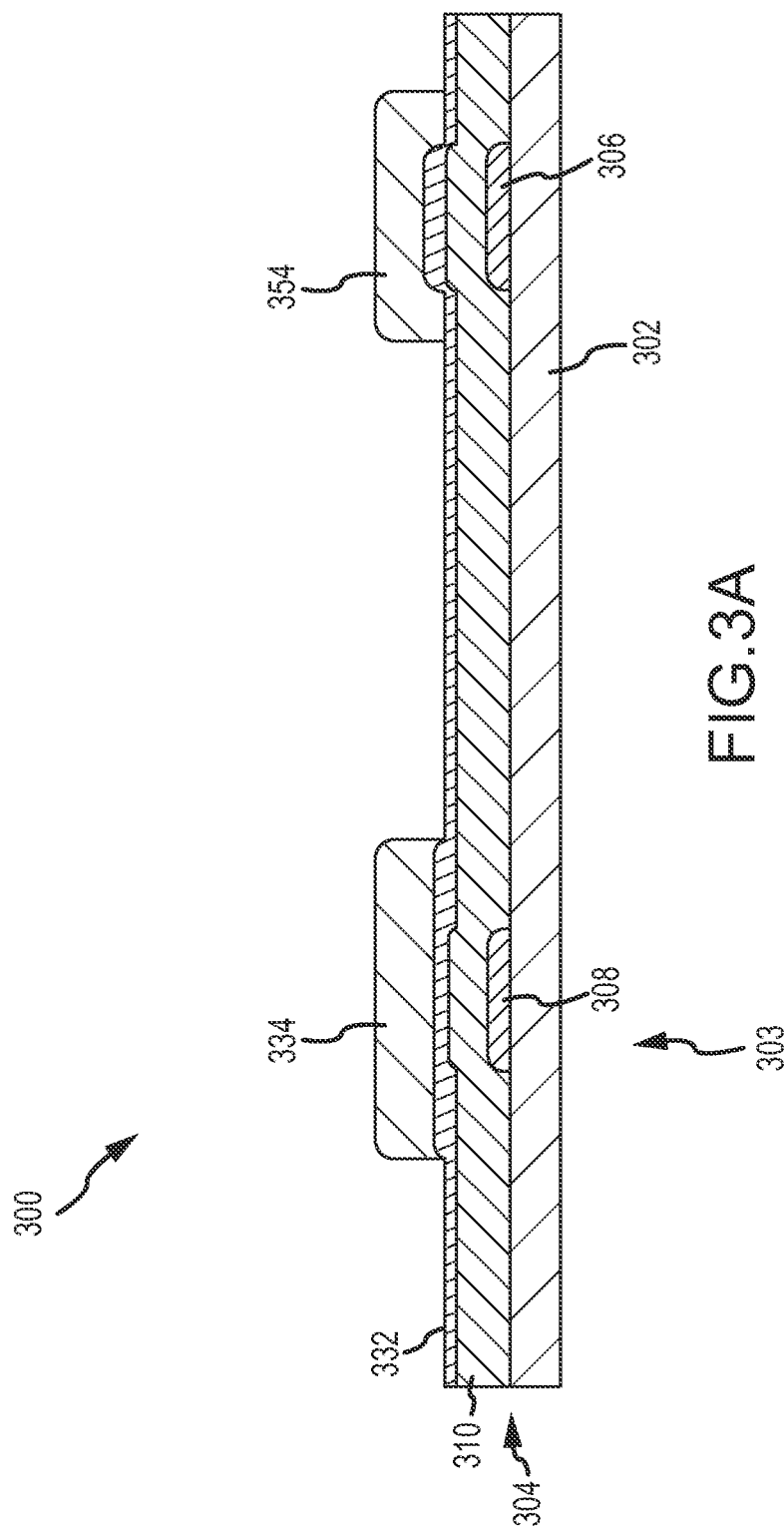

The process flow for the construction of the semiconductor device 300 begins with the application of a first mask that is used to form device features that are routed in a first metal layer 304. First, a layer of metal is deposited on an exposed surface of a substrate 302. Next, unwanted areas of metal are removed as dictated by the first mask so as to form device features. As shown in FIG. 3A, this application of the first mask operates to form at least a $V_{COM}$ signal line 306, as well as a gate 308 for a thin film transistor 303.

After the first mask is applied, a gate insulation layer 310 is deposited onto the semiconductor device 300, covering both the $V_{COM}$ signal line 306 and the gate 308 of the transistor 303. In one embodiment, the gate insulation layer 310 is composed of silicon dioxide ($SiO_2$). In another embodiment, the gate insulation layer 310 is composed of SiNx.

The process flow for the construction of the semiconductor device 300 continues with the application of a second mask that is used to form device features that are disposed in a layer of metal oxide. In one embodiment, the metal oxide is indium gallium zinc oxide (IGZO). First, a layer 332 of metal oxide is deposited onto the exposed surface of the semiconductor device 300. Next, unwanted areas of the metal oxide layer 332 are etched away or otherwise removed as dictated by the second mask so as to form device features. This application of the second mask operates to form the metal oxide structure 314 for the transistor 303, as shown in detail in FIG. 3A and FIG. 3B.

FIG. 3A is an illustration of a semiconductor device 300 prior to the application of a light source or other energy source that removes unwanted portions of the metal oxide layer 332. Specifically, FIG. 3A shows a photoresist patterns 334, 354 that are applied as dictated by the second mask. The photoresist patterns 334, 354 covers wanted portions of the metal oxide layer 332 such that the light source affects the photoresist and leaves the underlying areas unaffected. Likewise, the photoresist pattern 334, 354 does not cover unwanted portions of the metal oxide layer 332 such that these areas are exposed to the light source. Thus, the application of the light source will remove the photoresist pattern 334, 354 and unwanted portions of the metal oxide layer 332 such that metal oxide remains above the gate 308 in order to form the metal oxide structure 314 of the transistor 303. Additionally, after application of the light source, metal oxide remains above the $V_{COM}$ line to form a hard mask 356 that will be used in connection with forming a viahole that connects to the underlying $V_{COM}$ line 306. The device features that result from the application of the second mask can be seen in the FIG. 3B.

Figure 3B:
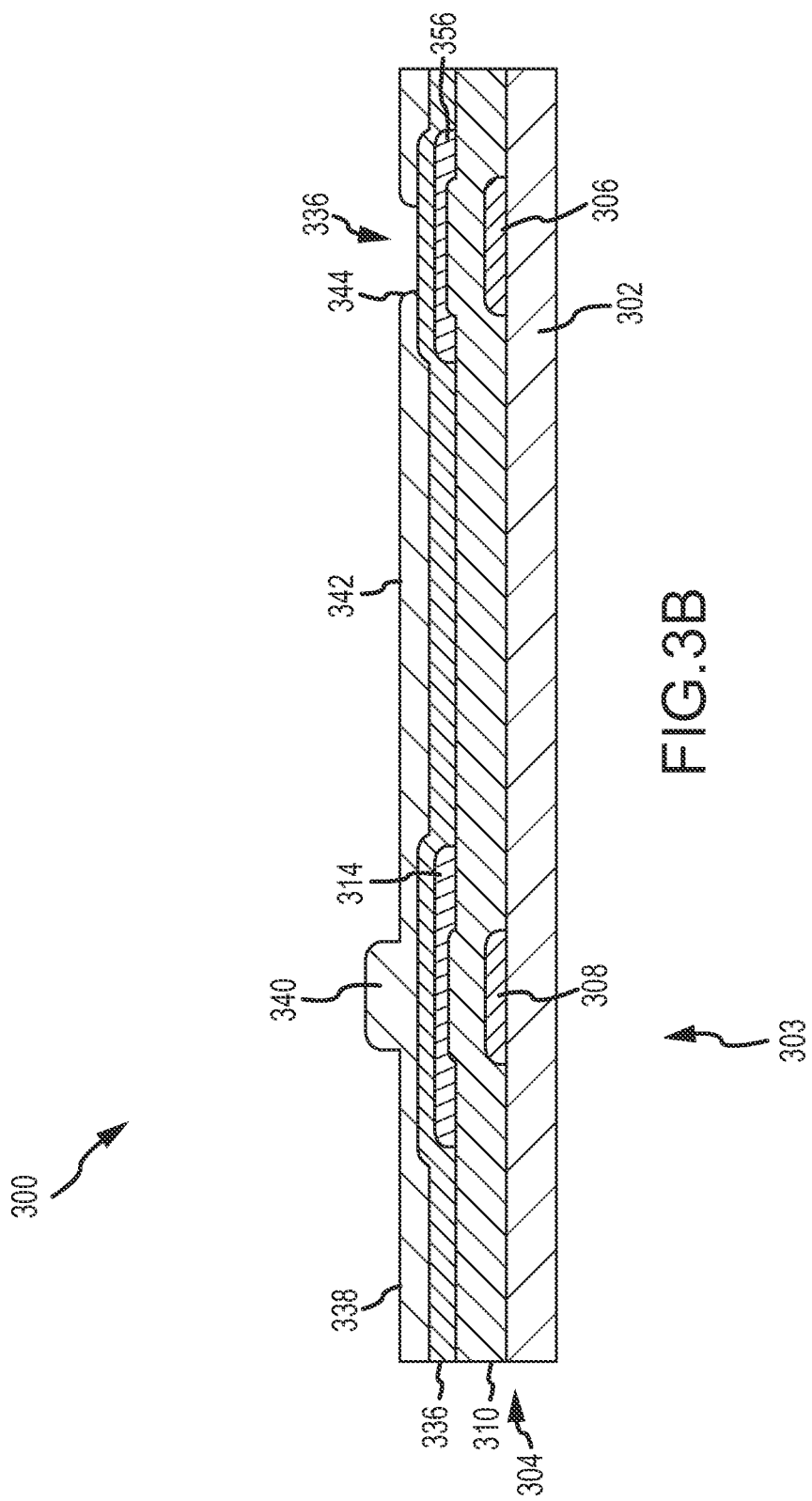
Figure 3C:
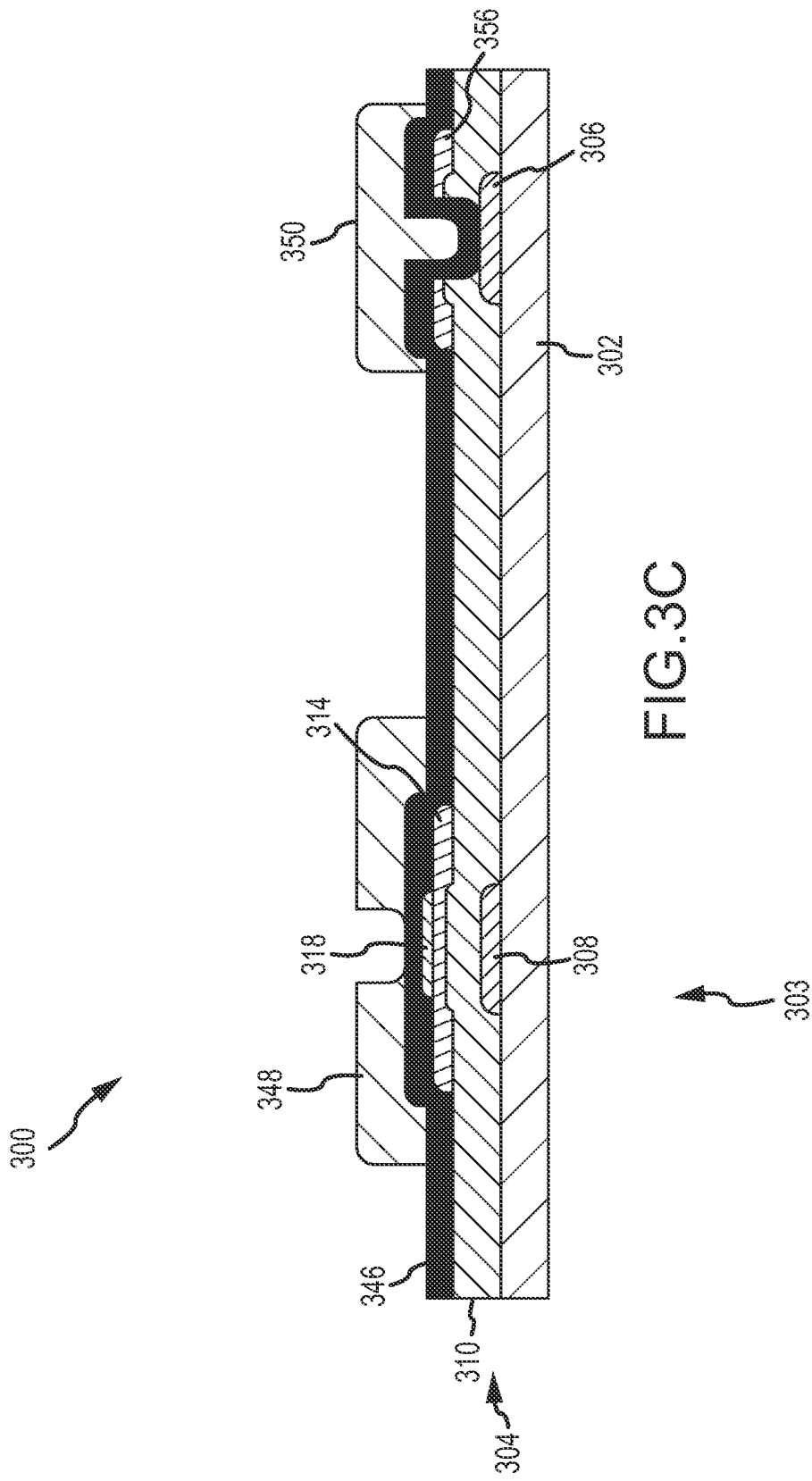

FIG. 3B additionally illustrates the application of a third mask used in the construction of the semiconductor device 300. In one respect, the third mask is used to form device features that are located in an etch stop layer. In another respect, the mask operates to enable a first of two etches that create the connection to the $V_{COM}$ signal line 306, which is routed in the first metal layer 304. In order to accomplish both of these tasks, the third mask is a half tone mask that produces a photoresist pattern 338 having a variable thickness. More specifically, the photoresist pattern 338 includes an area of full thickness 340 and an area of half thickness 342. Additionally, the photoresist pattern 338 produced by the third mask includes an area 344 having no photoresist material. The operation of the third mask is illustrated in FIGS. 3B and 3C.

First, as shown in FIG. 3B, a layer 336 of etch stop material is deposited onto an exposed surface of the semiconductor device 300. Next, in preparation for an etching operation, a photoresist pattern 338 is deposited onto the etch stop layer 336 in a pattern that is dictated by the third mask. As can be seen in FIG. 3B, the photoresist pattern 338 is formed with a half tone mask such that photoresist material is formed in a layer 338 having a full thickness area 340. The full thickness area 340 of the photoresist pattern 338 is formed on an area of the etch stop layer 336 corresponding to an area that is to be formed as a metal oxide of the thin film transistor 303. When the etching operation occurs, the full thickness 340 of the photoresist pattern 338 is etched away to expose or otherwise reach the etch stop layer 336. The etch stop element 318 that remains after the full thickness 340 of the photoresist pattern 338 has been etched protects the metal oxide structure 314 of the thin film transistor 303 during a subsequent etch that removes portions of a second metal layer.

As can also be seen in FIG. 3B, the photoresist pattern 338 (which is deposited as dictated by the half-tone third mask in preparation for an etching operation) is formed such that no photoresist material is located on an area 344 of the etch stop layer 336 that is above the $V_{COM}$ line 306, which is routed in the first metal layer 304. When the etching operation occurs, this area 344 is etched to form a portion of the viahole 326 that connects to the $V_{COM}$ line 306. Here, those portions of the etch stop layer 336, the hard mask 356, and the gate insulation layer 310 that are located in the area 344 are etched away so that the metal of the underlying $V_{COM}$ line 306 is exposed. This process is explained below in greater detail in connection with FIGS. 3D-F.

Further, the photoresist pattern 338 (which is deposited as dictated by the half-tone third mask in preparation for an etching operation) is formed such that photoresist material has a half thickness area 342. The half thickness area 342 of the photoresist pattern 338 is formed on areas of the etch stop layer 336 not including an area that is to be formed as a metal oxide of the thin film transistor 303 and not including the area 344 that is to be etched to form the viahole 326. When the etching operation occurs, the half thickness area 342 and those portions of the etch stop layer 336 that underlie the half thickness area 342 are etched away. Thus, following this etching operation, the gate insulation layer 310 is exposed in those areas that were covered by the half thickness area 342.

Figure 3D:
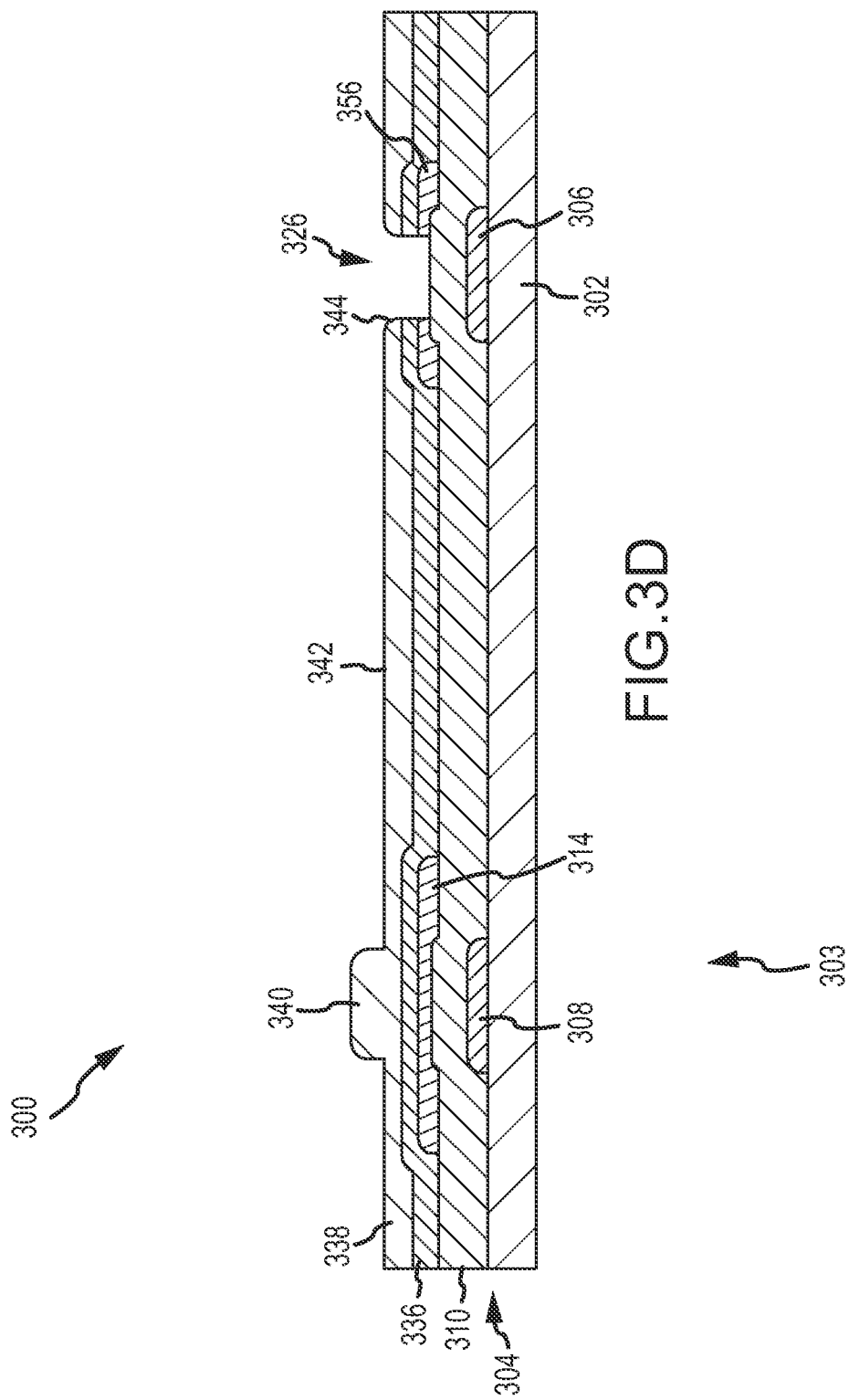
Figure 3E:
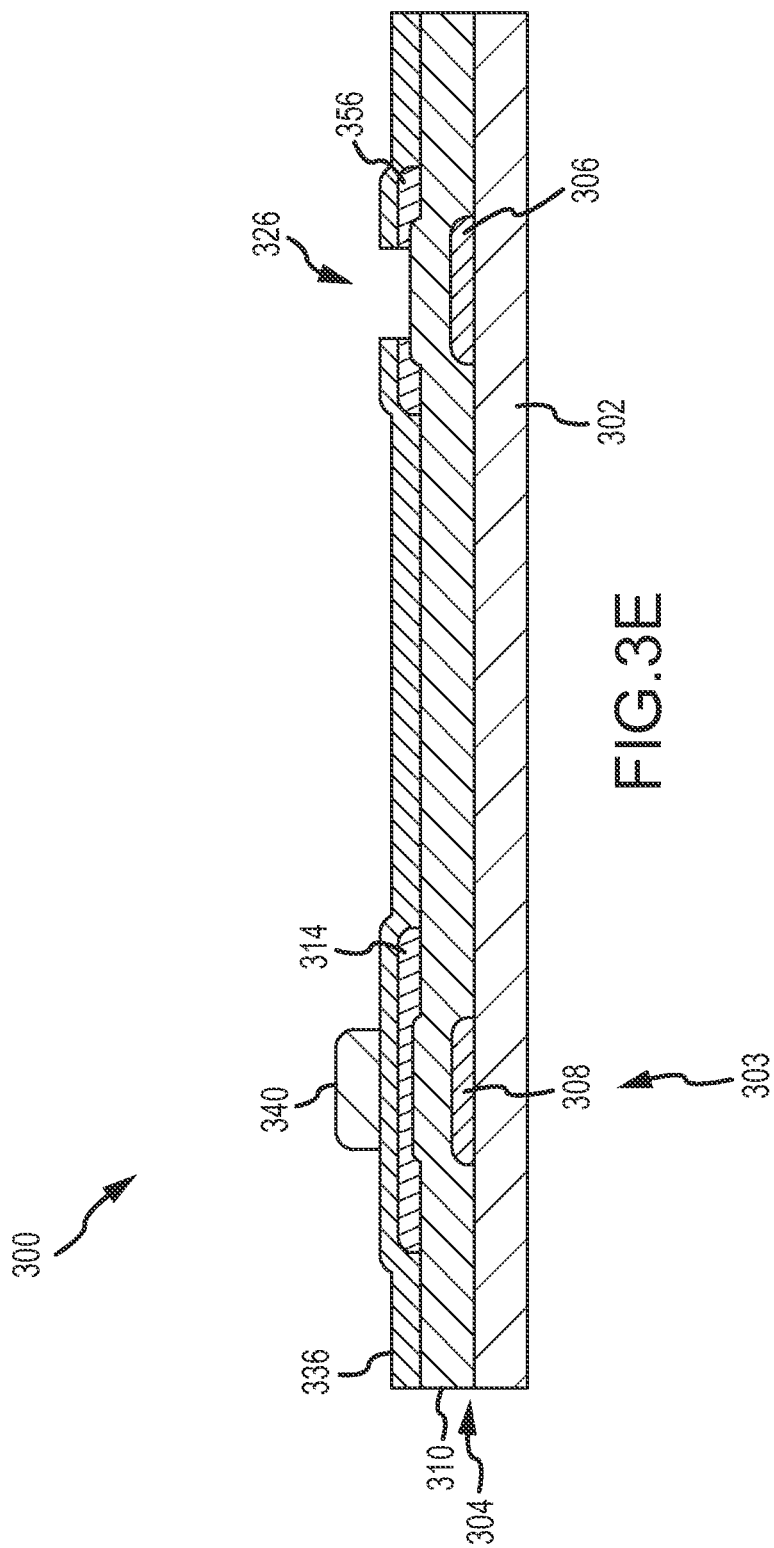
Figure 3F:
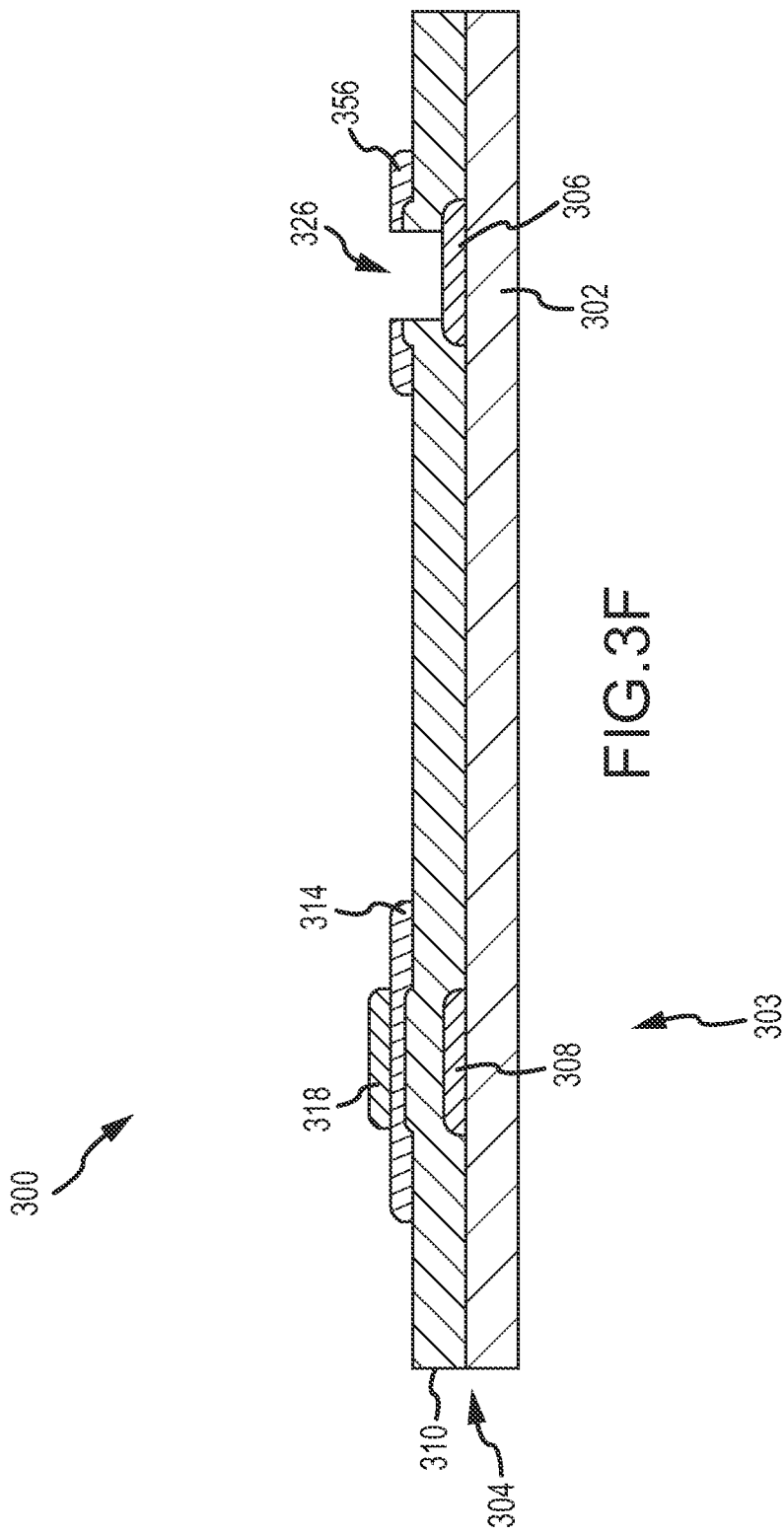
Figure 3H:
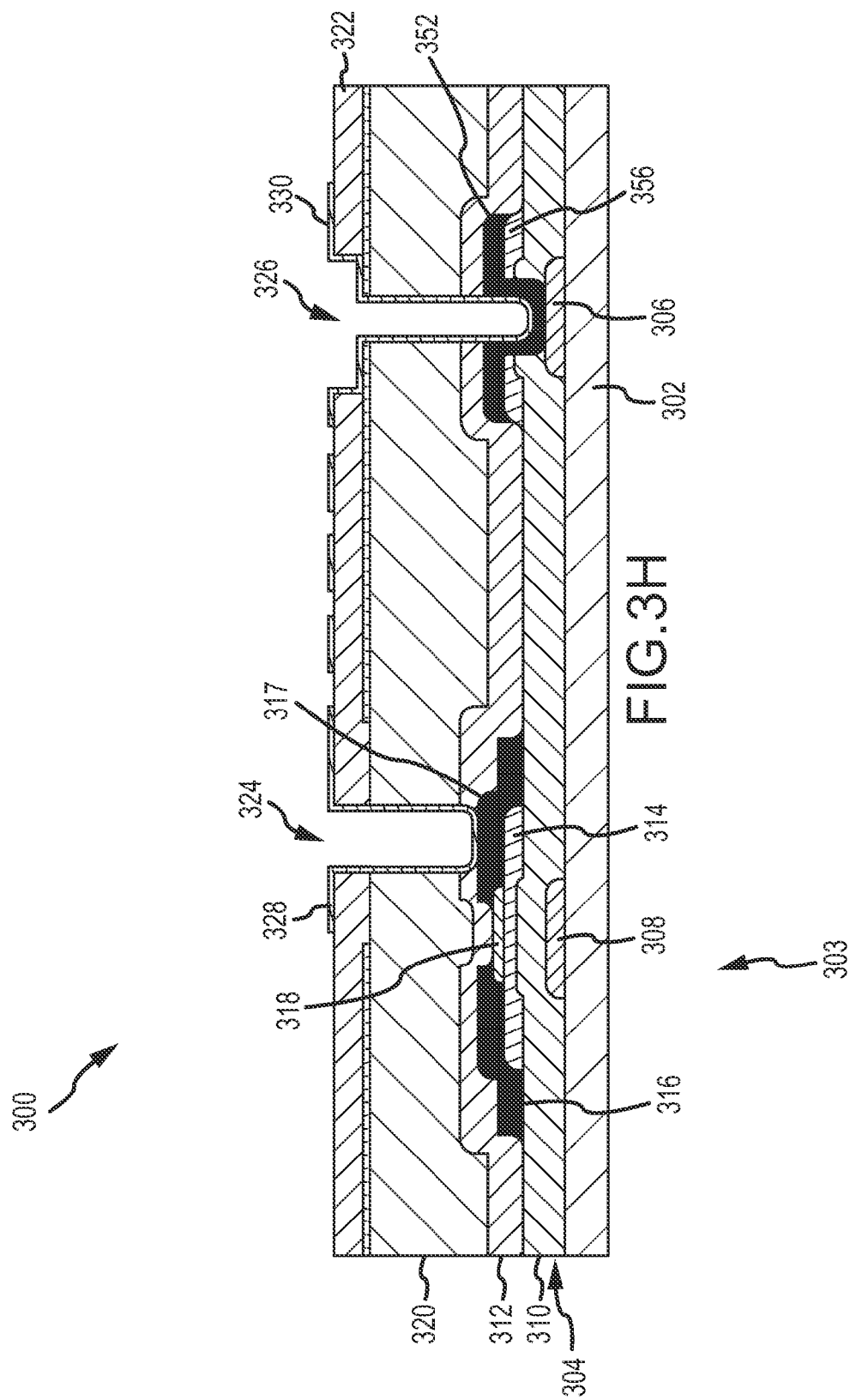

Referring now to FIGS. 3D-F, the process of exposing the metal of the underlying $V_{COM}$ line 306 by etching away those portions of the etch stop layer 336, the hard mask 356, and the gate insulation layer 310 that are located in the area 344 will now be described in greater detail. Initially, that portion of the etch stop 336 that is in the area 344 is removed with a dry etch. Next, that portion of the hard mask 356 that is in the area 344 is removed by a wet etch. Finally, the light source is applied to semiconductor device 200. Specifically, the light source first removes the half thickness area 342 of photoresist and a portion of the full thickness area 340 of photoresist. Following this, the light source removes the remainder of the full thickness area 340 of photoresist, as well as those portions of the etch stop layer 336 that were under the half thickness area 342 of photoresist. Here, the light applied source applied to the semiconductor device 200 additionally operates to etch away the gate insulation layer 310 in the area 344 to thus expose the underlying layer one metal 304.

The process flow for the construction of the semiconductor device 300 continues with the application of a fourth mask that is used to form device features that are disposed in a second metal layer. In one respect, the application of the fourth mask operates to form the source electrode 316 and the drain electrode 317 for the transistor 103. In another respect, the application of the fourth mask operates to form a connection to the $V_{COM}$ line 306, which is routed in the first metal layer 304. First, the second metal layer 346 is deposited on the exposed surface of the semiconductor device 300. Here, metal is deposited in the first portion of the viahole 326 that was etched in connection with the application of the third mask. In this way, an electrical connection 352 to the $V_{COM}$ line 306 is formed when the layer two metal 346 contacts the layer one metal 304 that is exposed within the viahole 326. Following the deposition of the second metal layer 346, unwanted areas of the second layer 346 are etched away or otherwise removed as dictated by the fourth mask.

FIG. 3C is an illustration of a semiconductor device 300 prior to the application of a light source that removes unwanted portions of the second metal layer 346. Specifically, FIG. 3C shows first 348 and second 350 photoresist patterns that are applied as dictated by the fourth mask. The photoresist patterns 348, 350 cover wanted portions of the second metal layer 346 such that the light source affects the photoresist and leaves the underlying areas unaffected. Likewise, the photoresist patterns 348, 350 do not cover unwanted portions of the second metal layer 346 such that these areas are exposed to the light source. Thus, the application of the light source will remove the photoresist patterns 348, 350 and unwanted portions of the second metal layer 346 such that metal remains at two locations to form the source electrode 316 and the drain electrode 317 of the transistor 303. Additionally, after application of the light source, metal remains in the viahole 326 in order to maintain the connection 352 to the $V_{COM}$ line 306, which routed in the first metal layer 304. The device features that result from the application of the fourth mask can be seen in the FIG. 3D.

The process flow for the construction of the semiconductor device 300 continues with the application of a fifth mask that is used to create a passivation layer 312 and an organic layer 320 having viaholes 324, 326 that extend there though to make connections to underlying device features. First, a passivation layer 312 and an organic layer 320 are deposited onto the exposed surface of a semiconductor device 300. Next, unwanted areas of the passivation layer 312 and the organic layer 320 are removed as dictated by the fifth mask so as to create viaholes 324, 326 that extend through the passivation layer 312 and the organic layer 320. As can be seen in FIG. 3D, the application of the fifth mask produces a via hole 324 that connects to the source 317 of the transistor 303. The application of the fifth mask additionally produces a portion of the viahole 326 that connects to the $V_{COM}$ line 306, which is routed in the first metal layer 304. More specifically, the viahole 326 connects to the $V_{COM}$ line 306 through the connection 352 that is disposed in the second metal layer 346.

Following the application of the fifth mask, the process flow for the construction of the semiconductor device 300 continues with the application of a sixth mask that applies a thin film of transparent conducting oxide 330 which provides a connection to the $V_{COM}$ line 306. In one embodiment, the thin film of transparent conducting oxide is indium tin oxide (ITO). As shown in FIG. 3E, the transparent conducting oxide 330 is applied in a pattern dictated by the sixth mask such that the transparent conducting oxide 330 is deposited on an interior surface of the viahole 326. In this way, the thin film of transparent conducting oxide 330 makes a connection to the $V_{COM}$ line 306, which is routed in the first metal layer 304. More specifically, the thin film of transparent conducting oxide 330 connects to the $V_{COM}$ line 306 through the connection 352 that is disposed in the second metal layer 346.

The process flow for the construction of the semiconductor device 300 continues with the application of a seventh mask that is used to create a second passivation layer 322 such that the viaholes that underlie the second passivation layer 322 are maintained. Following this, the process flow for the construction of the semiconductor device 300 continues with the application of an eighth mask that applies a thin film of transparent conducting oxide 328. As shown in FIG. 3E, the thin film of transparent conducting oxide 328 provides a connection to the transistor 303. The transparent conducting oxide 328 is applied in a pattern dictated by the eighth mask such that the transparent conducting oxide 328 is deposited on an interior surface of the viahole 324. In this way, the thin film of transparent conducting oxide 328 makes a connection to the drain 317 of the transistor 303.

The application of the fifth mask produces a second portion of the viahole 326. As described above, the first portion of the viahole 326 is formed during the application of the third mask. Thus, the etching of viahole 326 is divided into two separate steps that occur at different times during the construction of the semiconductor device 300. This two-step etch is advantageous because it avoids creating the viahole in a long single step etch.

CONCLUSION

The foregoing description has broad application. Accordingly, the discussion of any embodiment is meant only to be an example and is not intended to suggest that the scope of the disclosure, including the claims, is limited to these examples.

We claim:

1. A method of connecting to a first metal layer in a semiconductor flow process, comprising:
    etching a first portion of a viahole through an etch stop layer and a gate insulation layer to reach a first metal layer;
    depositing a second metal layer such that the second metal layer contacts the first metal layer within the viahole; and
    etching a second portion of the viahole through a first passivation layer and an organic layer to reach the second metal layer;
    wherein said etching the first portion of the viahole occurs following a first set of semiconductor process operations, comprising forming the first metal layer on a substrate, forming the gate insulation layer on the first metal layer, forming a metal oxide layer on the gate insulation layer, forming an etch stop layer on the metal oxide layer, and forming a photoresist pattern on the etch stop layer; and
    wherein the photoresist pattern is formed such that no photoresist material is located on an area of the etch stop layer that is to be etched to form the viahole.

2. The method of claim 1, wherein said etching a first portion of the viahole further comprises etching through a metal oxide layer.

3. The method of claim 1, wherein the gate insulation layer is silicon dioxide.

4. The method of claim 1, wherein the gate insulation layer is SiNx.

5. The method of claim 1, wherein the metal oxide layer is indium gallium zinc oxide.

6. The method of claim 1, wherein the photoresist pattern is formed with a half tone mask such that photoresist material is formed in a layer having a full thickness area and a half thickness area.

7. The method of claim 6, wherein the half thickness area of the photoresist pattern is formed on areas of the etch stop layer not including an area that is to be formed as a channel of a thin film transistor and not including the area that is to be etched to form the viahole.

8. The method of claim 7, wherein said etching the first portion of the viahole includes etching the half thickness of the photoresist pattern and the etch stop layer that underlies the half thickness of photoresist to reach the gate insulation layer.

9. The method of claim 6, wherein the full thickness area of the photoresist pattern is formed on area of the etch stop layer corresponding to an area that is to be formed as a channel of a thin film transistor.

10. The method of claim 9, wherein said etching the first portion of the viahole includes etching the full thickness of the photoresist pattern to reach the etch stop layer.

11. The method of claim 10, wherein the etch stop layer that remains after the full thickness of the photoresist pattern has been etched protects the metal oxide of the thin film transistor during a subsequent etch that removes portions of the second metal layer.

12. A method of connecting to a first metal layer in a semiconductor flow process, comprising:
    etching a first portion of a viahole through an etch stop layer and a gate insulation layer to reach a first metal layer;
    depositing a second metal layer such that the second metal layer contacts the first metal layer within the viahole; and
    etching a second portion of the viahole through a first passivation layer and an organic layer to reach the second metal layer;
    wherein said etching the second portion of the viahole occurs following a second set of semiconductor process operations that occur after the operation of depositing the second metal layer, the second set of operations comprising
    forming a photoresist pattern on the second metal layer;
    etching the second metal layer such that the photoresist pattern causes the second metal layer to remain within the viahole and to remain on areas that form a source and a drain of a thin film transistor;
    depositing the first passivation layer; and
    depositing the organic layer.

13. The method of claim 12, further comprising depositing a thin film of transparent conducting oxide after said etching the second portion of the viahole.

14. The method of claim 13, wherein the transparent conducting oxide is indium tin oxide.

15. A method of connecting to a first metal layer in a semiconductor flow process, comprising:
    etching a first portion of a viahole through an etch stop layer and a gate insulation layer to reach a first metal layer;
    depositing a second metal layer such that the second metal layer contacts the first metal layer within the viahole; and
    etching a second portion of the viahole through a first passivation layer and an organic layer to reach the second metal layer;
    wherein the viahole provides a connection to a $V_{COM}$ signal that is routed in the first metal layer.

16. A method of connecting to a first metal layer in a semiconductor process, comprising:
    etching a first portion of a viahole through an etch stop layer, a metal oxide layer, and a gate insulation layer to reach a first metal layer;
    depositing a second metal layer such that the second metal layer contacts the first metal layer within the viahole; and
    etching a second portion of the viahole through a second passivation layer and a first passivation layer to reach the second metal layer;
    wherein said etching the first portion of the viahole occurs following a first set of semiconductor process operations, comprising
    forming the first metal layer on a substrate;
    forming the gate insulation layer on the first metal layer;
    forming a metal oxide layer on the gate insulation layer;
    forming a first photoresist pattern on the metal oxide layer;
    etching the metal oxide layer such that the first photoresist pattern causes metal oxide material to remain on an area to be formed as a metal oxide of a thin film transistor and on an area to be etched for the viahole;
    forming an etch stop layer on the metal oxide layer; and
    forming a second photoresist pattern on the etch stop layer such that no photoresist material is located on the area to be etched for the viahole.

17. The method claim 16, wherein said etching the first portion of the viahole through the metal oxide layer comprises a dry etch through the etch stop layer, a wet etch through the metal oxide layer, and a dry etch through the gate insulation layer.

* * * * *